United States Patent [19]

Habra

[11] Patent Number: 5,295,081
[45] Date of Patent: Mar. 15, 1994

[54] CONCURRENT INTERACTIVE WIRE EDITING

[75] Inventor: Rafik R. Habra, Wappingers Falls, N.Y.

[73] Assignee: International Business Machines Corporation, Armonk, N.Y.

[21] Appl. No.: 968,709

[22] Filed: Oct. 30, 1992

[51] Int. Cl.⁵ ............................................. G06F 15/00
[52] U.S. Cl. .................................... 364/489; 364/488; 364/490; 364/491
[58] Field of Search ............... 364/488, 489, 490, 491, 364/513, 200; 395/140, 141, 155, 160, 161, 400

[56] References Cited

U.S. PATENT DOCUMENTS

| | | | |
|---|---|---|---|
| 4,593,363 | 6/1986 | Burstein et al. | 364/491 |
| 4,864,497 | 9/1989 | Lowry et al. | 364/300 |
| 4,908,772 | 3/1990 | Chi | 364/491 |
| 4,965,741 | 10/1990 | Winchell et al. | 364/513 |
| 5,008,853 | 4/1991 | Bly et al. | 364/900 |
| 5,129,070 | 7/1992 | Dorotte | 395/400 |
| 5,164,907 | 11/1992 | Yabe | 364/491 |

Primary Examiner—Thomas G. Black
Assistant Examiner—Jacques H. Louis-Jacques
Attorney, Agent, or Firm—Whitham & Marhoefer

[57] ABSTRACT

A method for allowing multiple users to simultaneously edit circuit wiring data, such as VLSI circuit data. The circuit data, contained in a computer database, is partitioned into a plurality of "parcels". Two types of wiring networks are identified within each parcel, internal and external. An internal network is completely enclosed within a parcel, whereas an external net spans two or more parcels. Each of the parcels may be simultaneously worked on by an individual user or circuit designer. Changes made to an internal wiring network has no impact on any of the other parcels. Changes made to an external wiring network does impact on other parcels which share the external network. A "design controller" is provided which restricts editing accessibility of an external network to one user at a time and locks out all other users. After changes are made to an external wiring network the database and the other parcels are updated to reflect the changes before the external network can be accessed again.

13 Claims, 3 Drawing Sheets

CONCURRENT INTERACTIVE WIRE EDITING

BACKGROUND OF THE INVENTION

1. Field of the Invention

The present invention generally relates to an improved method for computer aided design of logic circuits, such as very large scale integrated (VLSI) circuits, and more particularly, to a method which allows several designers to simultaneously or concurrently edit circuit wiring.

2. Description of the Prior Art

The number of circuit components on, and the complexity of, very large scale integrated circuits is enormous and is increasing. More complicated circuits are being designed and implemented as very large scale integrated (VLSI) circuits containing millions of components and wired interconnections or networks. Typically, VLSI circuit wiring follows channels forming an addressable grid pattern. In such VLSI circuits there may be 1000 by 1000 channels or 1,000,000 or more addressable wiring locations. A wire network seldom follows a single channel in straight line, but rather follows a set of connecting channels all running along the grid. The complexity of such circuits necessitates not only that computers be used to manage the vast amounts of design related data, but also that a number of designers work simultaneously on the design in order to complete it within a reasonable time period.

A well known hierarchical design approach, also known as "top-down" design, evolves breaking a large circuit design into several, simpler, functional modules, each of which are further decomposed into submodules and so on until the lowest level submodules are simple enough to implement. U.S. Pat. No. 4,890,238 to Klein et al. discloses a hierarchical design method for VLSI chip design. The circuit is partitioned into areas that are shaped to fit together perfectly without any area remaining in between. Each partition is a self-contained piece of logic. All connections needed to interconnect neighboring partitions are included in each partition. Global wiring connections are routed directly through various partitions rather than around them. Internally, global wires crossing a partition are handled as if they were part of that partition. Each partition can be designed independently of the other partitions. The individual circuit partitions are then shaped and placed together such that outputs from one partition are inputs to an adjacent partition. "Transfer books" are placed at partition boundaries and serve as wiring channel cross points which "snap" together to connect the overall logic structure.

"Floorplanning" is another approach to VLSI circuit design which involves automatically placing logic and memory elements on an integrated circuit. Such an approach is disclosed in U.S. Pat. No. 4,918,614 to Modarres et al.. Floorplanning allocates space between circuit elements for wiring interconnections. Parameters such as circuit density and the likelihood of interconnections among certain circuit elements are taken into account in order to minimize the actual chip area and maximize the probability that circuit wiring interconnections between elements can be routed within the space allocated.

Hierarchal and floorplanning methods are directed to the initial design and layout stages of a VLSI circuit. Such prior art methods which rely on VLSI circuit partitioning lack efficient external wiring schemes between the individual modules. Thus, they are not easily adaptable to wire editing applications in the later circuit design stages.

SUMMARY OF THE INVENTION

It is therefore a purpose of the present invention to provide a VLSI circuit wiring design method which partitions a VLSI chip into smaller parcels such that a plurality of users can simultaneously edit a complex design or layout.

It is yet another purpose of the present invention to provide a VLSI circuit using a wiring design method which shortens the design cycle of a VLSI chip design.

It is yet another purpose of the present invention to provide a VLSI circuit using a wiring design method which does not involve complicated partitioning schemes.

According to the invention, VLSI circuit wiring data, e.g., flat (complete) VLSI circuit wiring data, is contained in a computer database and is partitioned into a plurality of rectangular and contiguous partitions or "parcels". Two types of wiring networks are identified within each parcel, internal and external. An internal network is completely enclosed within a parcel, whereas an external net is shared by two or more parcels.

Each of the parcels may be simultaneously worked on by an individual user or circuit designer. Changes or edits made to an internal wiring network has no impact on the internal wiring network of any other parcel.

However, changes made to external wiring networks impacts on the other parcels which share the external network. To avoid confusion which would develop if two or more users tried to simultaneously edit the same shared external network, a "design controller" is provided which restricts editing accessibility of an external network to one user at a time and locks out all other users.

Additionally, any changes made to an external wiring network by one user is updated in the database and at the other parcels before further editing of that external network is allowed.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
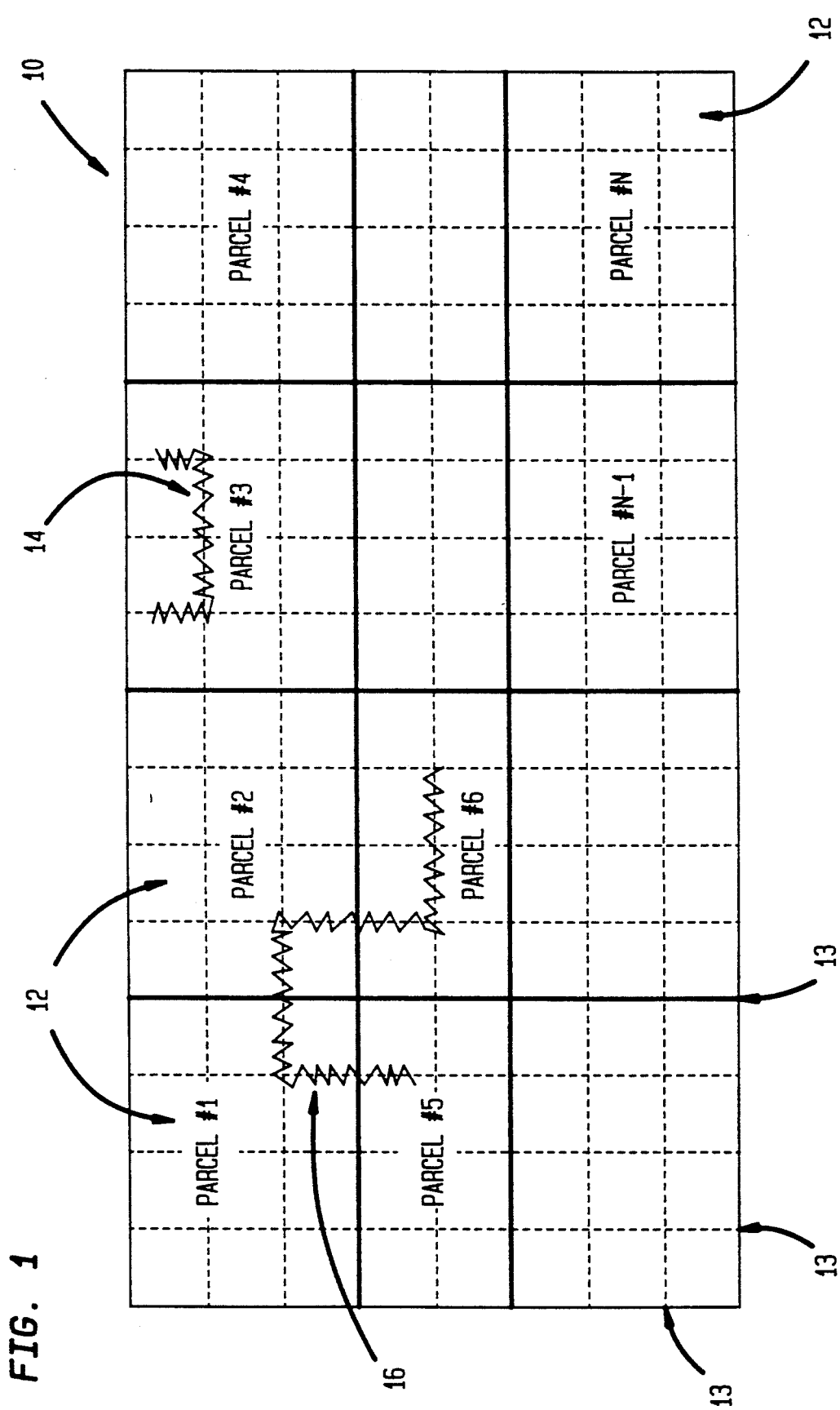
FIG. 1 is a diagram showing a VLSI circuit partitioned into N parcels.

Referring now to the drawings, and more particularly to FIG. 1, there is shown a diagram depicting an electronic circuit, such as a VLSI circuit, generally referred to by the reference numeral 10. The VLSI circuit 10 is stored as sets of data in a computer database 22. The circuit 10, is divided into a plurality of parcels which are generally referred to by reference numeral 12 and are labeled as parcel number one through parcel number N. In the preferred embodiment, the circuit wiring runs along channels 13 which form a grid pattern. The circuit 10 is typically divided into rectangular, contiguous parcels 12, along selected channels 13. However, as it will be appreciated by those skilled in the art, many circuit partitioning schemes exist which can be used within the practice of this invention.

Within each parcel 12 there is a plurality of circuit components which are connected to one another by a wiring network contained entirely within a parcel. These are referred to as internal wiring networks, or simply as "internal nets" 14. An example of an internal net 14 is shown contained entirely within parcel number three. An internal net may be edited at any time, but only by a user to whom the parcel that contains the internal net is assigned.

In addition, to internal nets 14, there are a plurality of wiring networks which are not contained entirely within a parcel. These are referred to as external wiring networks, or simply as "external nets" 16. An external net 16 is shown shared by parcels five, one, two and six.

Figure 2:
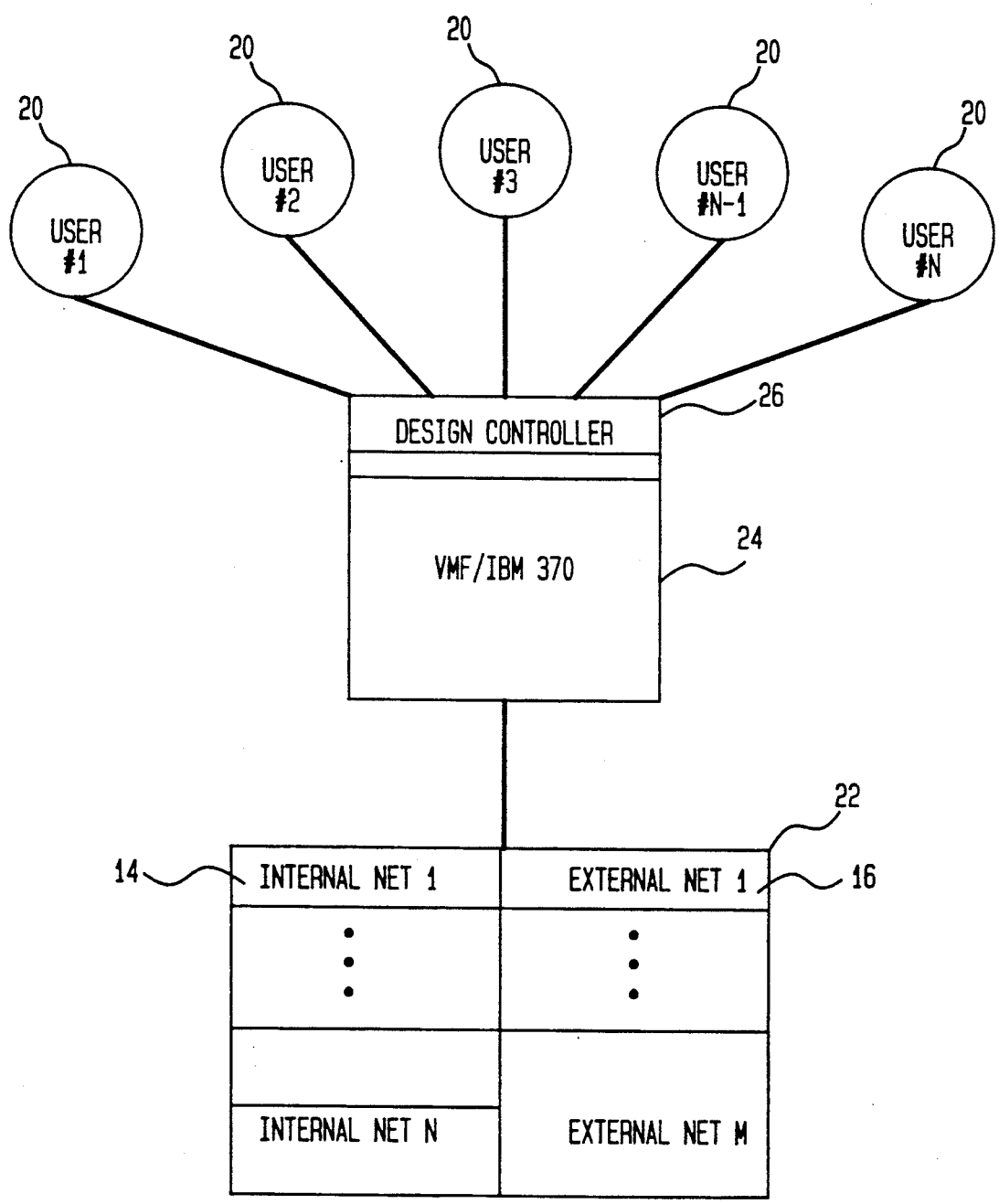
FIG. 2 is a diagram showing the overall system for multi-user circuit design editing.

Referring now to FIG. 2, there is shown a plurality of users 20, some of whom can simultaneously edit parcels of a VLSI circuit 10 which is stored on database 22. The users 20 are identified as user 1, 2... N. In the preferred embodiment the invention is implemented with a virtual machine facility (VMF) 24 such as the Multiple Virtual Storage (MVS) operating, for example, on an IBM System/370 (Trademark of IBM Corp., Armonk, NY, U.S.A.) computer. The VMF 24 is a time sharing system control program which includes a control program for managing computer resources so that multiple remote terminal users 20 have a functional simulation of a computing system (virtual machine) at their disposal. The VMF 24 permits users 20 simultaneous controlled access to database 22.

Within each parcel the virtual machine facility (VMF) 24 identifies the internal nets 14 and the external nets 16. Each parcel 12 can be individually worked on and edited by a user 20, located at a workstation or remote computer which is connected to the VMF 24. A user 20 can only edit internal nets 14 and external nets 16 within their assigned parcel 12. The user can edit internal nets 16 within his or her assigned parcel and update the database without restriction, since changes in an internal net do not effect other parcels, other users are locked out from editing an internal net. However, a user is permitted to observe parcels 12 other than their own.

A user 20, can of course, be assigned any parcel 20, and the parcel assignment for a user can change. This is only possible assuming that parcel 12 is idle and no other user is working on it. The user 20 can only work on the second parcel 12, after he has signed-off and relinquished all his access to the first parcel 12. The first parcel 12 now becomes available to any other user 20.

As it will be appreciated by those skilled in the art, simultaneous editing of an external net 16 causes problems since typically the database 22 is not updated until after editing is complete. Circuit data related to an external net 16 relied upon by a particular user may not be current if another user is in the process of editing the same external net 16. In this situation, wires may be edited that no longer exist, or that are no longer relevant.

To overcome this problem, a design controller 26 is interposed in the path between the VMF 24 and the users 20. In the preferred embodiment this design controller 26 is implemented by software running with the VMF 24. However, the design controller 26 could be a separate unit connected to the VMF 24. The design controller 26 locks out all but one user from editing a shared external net 16 at a time.

Figure 3:
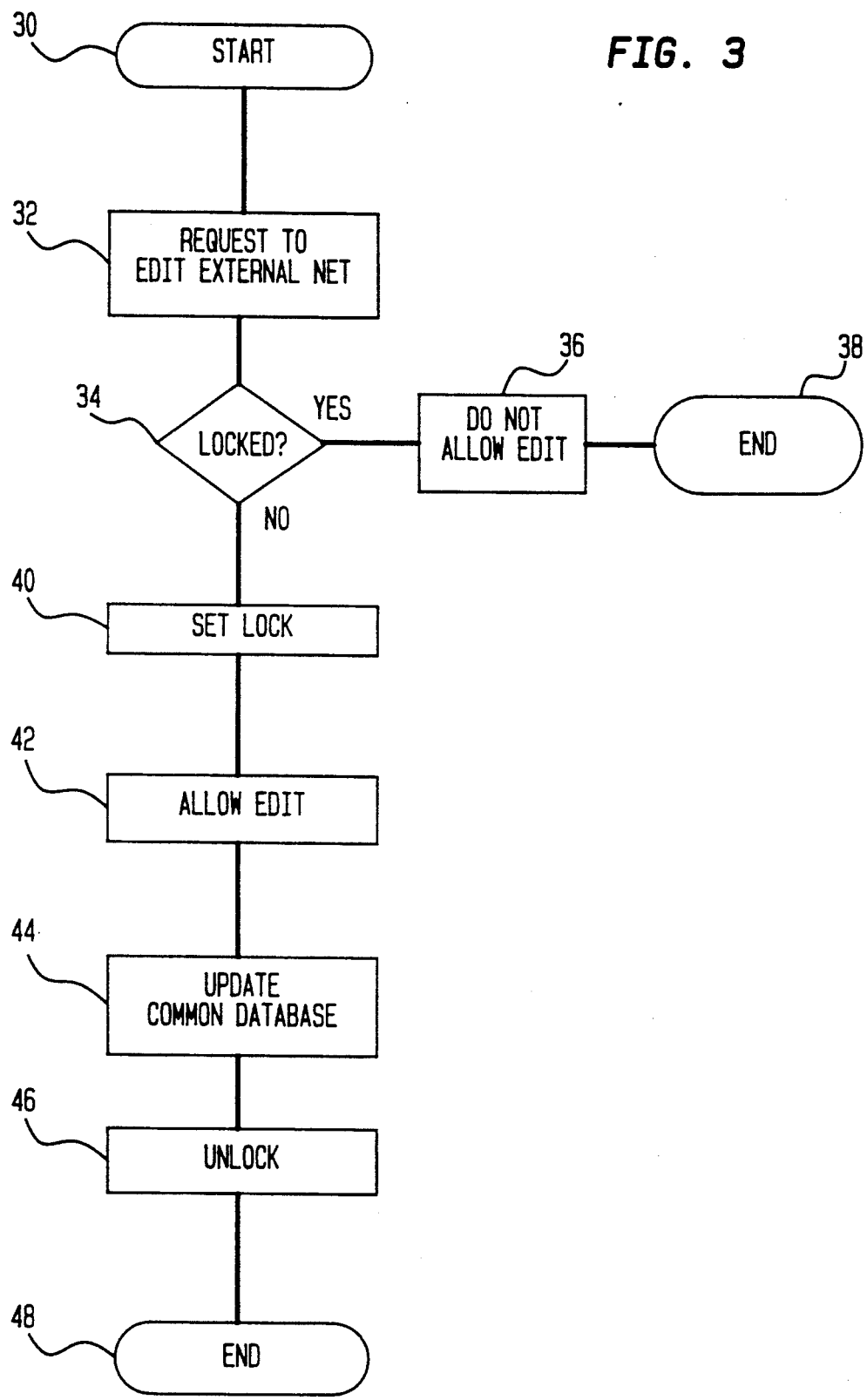
FIG. 3 is a flow diagram for the design controller.

FIG. 3 is a flow diagram showing steps the design controller 26 takes in order to insure that only one user 20 has edit privileges to a shared external net 16 at any one time. The controller 26 starts at block 30. A user 20 requests to edit an external net, block 32. This may or may not be a conscious request on the user's 20 part. The user may merely attempt to edit a particular wire within their parcel that is part of an external net 16. The design controller 16 checks to see if a lock field, block 34, associated with the external net 16 is set. A locked condition indicates that another user 20 is currently editing the requested external net 16. At block 36, if the requested external net is locked, the requesting user 20 is not permitted to edit the external net 16 and the program ends, block 38. However, the requesting user 20 is permitted to observe the edits being made to the external net 16 by another user 20.

At block 34, an unlocked condition indicates that the requested external net 16 is not currently being edited. If this is the case, the lock field is locked at block 40. This ensures that other users now cannot edit the external net 16, until this user 20 is done with his editing of external net 16. Of course the other users 20 are permitted to obtain updated copies of the edits that were made to the external net 16, while remaining in their assigned parcel. This is only possible after the first user has stored his changes and edits at the external net 16, into the common database. The external net 16 is edited at block 42. After the edit is complete, the database 22 is immediately updated into the common database at block 44. The external net 16 is then unlocked, block 46, to make it available for future editing. The program of editing external nets 16 and internal nets 14, is completed at block 48.

With this invention an electronic circuit, such as a VLSI circuit is divided into smaller parcels containing both internal and external wiring networks. A user is allowed to operate only within their assigned parcel. A design controller is provided to ensure that only one user operates on an external wiring network at one time, and that only one user works on an internal wiring network at one time. In this manner, a large complicated circuit can be simultaneously edited by many users without conflicts between the users.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A computer aided design method for allowing a plurality of users to edit integrated circuit wiring, comprising the steps of:

partitioning a circuit into a plurality of parcels;

identifying internal wiring networks contained solely within a single one of said parcels;

identifying external wiring networks, said external wiring networks being shared by at least two of said parcels;

checking for an unlocked condition on said external wiring networks; and editing said external wiring networks if said unlocked condition is true.

2. A computer aided design method for allowing a plurality of users to edit integrated circuit wiring, as recited in claim 1, further comprising the step of:

locking said external wiring networks before said editing step, said locking step locking other of said users from said editing step.

3. A computer aided design method for allowing a plurality of users to edit an integrated circuit wiring as in claim 2, wherein said locking step allows one user to edit at least one external net and blocks access to said at least one external net to other users.

4. A computer aided design method for allowing a plurality of users to edit an integrated circuit wiring as n claim 2, wherein said locking step allows access to edit at least one external net to one user and includes the further step of displaying an edited external net to other users.

5. A computer aided design method for allowing a plurality of users to edit integrated circuit wiring, as recited in claim 1, wherein said parcels are contiguous.

6. A computer aided design method for allowing a plurality of users to edit integrated circuit wiring as in claim 1, wherein said integrated circuit wiring is wiring for a VLSI circuit.

7. A computer aided design method for allowing a plurality of users to edit an integrated circuit as in claim 1, including a locking step that allows one user to edit internal nets within a parcel and blocks access to said at least one internal net to other users.

8. A computer aided system for allowing a plurality of users to edit integrated circuit wiring, comprising:

a database means for storing data related to a circuit design;

a multi-user computing means for coordinating editing activities between said plurality of users and said database means, said multi-user computer means further for dividing said data into a plurality of parcels and for identifying external wiring networks shared by more than one of said parcels; and a design controller means, associated with said multi-user computing means, for permitting only one user at a time to edit any one of said external wiring networks.

9. A computer aided system for allowing a plurality of users to edit integrated circuit wiring, as recited in claim 8, wherein said multi-user computing means is a virtual machine facility.

10. A computer aided system for allowing a plurality of users to edit integrated circuit wiring as recited in claim 8, wherein said integrated circuit wiring is wiring for a VLSI circuit.

11. A computer aided system for allowing a plurality of users to edit integrated circuit wiring, as recited in claim 8, wherein said design controller means includes means to allow one user to edit an external net and to block access to said at least one external net to all other users.

12. A computer aided system for allowing a plurality of users to edit an integrated circuit wiring as in claim 8, wherein said design controller includes means to allow access to one user to edit an external net and includes means to allow all other users observational access to an edited external net.

13. A computer aided system for allowing a plurality of users to edit integrated circuit wiring as recited in claim 8, wherein said design controller includes means to allow one user to edit at least one internal net and blocks access to said at least one internal net to other users.

* * * * *